United States Patent [19]

Shirai et al.

[11] Patent Number: 4,869,995
[45] Date of Patent: Sep. 26, 1989

[54] POSITIVE TYPE PHOTOSENSITIVE RESINOUS COMPOSITION

[75] Inventors: Masamitsu Shirai; Masahiro Tsunooka; Makoto Tanaka; Kanji Nishijima, all of Osaka; Katsukiyo Ishikawa, Kyoto, all of Japan

[73] Assignee: Nippon Paint Co., Ltd., Osaka, Japan

[21] Appl. No.: 200,121

[22] Filed: May 27, 1988

[30] Foreign Application Priority Data

May 28, 1987 [JP] Japan ................... 62-132756

[51] Int. Cl.⁴ .............................. G03C 1/76
[52] U.S. Cl. .................. 430/270; 430/326; 522/100; 522/149
[58] Field of Search ............. 430/270, 326; 522/149, 522/100

[56] References Cited

U.S. PATENT DOCUMENTS

| | | | |
|---|---|---|---|
| 3,070,443 | 12/1962 | Neugebauer et al. | 430/270 |
| 4,160,666 | 7/1979 | McCabe et al. | 522/149 |
| 4,493,884 | 1/1985 | Nagano et al. | 430/326 |
| 4,666,820 | 5/1987 | Chandross et al. | 430/326 |
| 4,684,599 | 8/1987 | Dominh et al. | 430/270 |
| 4,686,168 | 8/1987 | Fuji et al. | 430/326 |

*Primary Examiner*—Jack P. Brammer
*Attorney, Agent, or Firm*—Wenderoth, Lind & Ponack

[57] ABSTRACT

A positive type photosensitive resinous composition which is specifically useful in a photoresist for printed circuit board, integrated circuit board and the like and in a lithographic plate is provided.

The resinous composition is characterized by comprising a resin having in its side chains or at the end portions of main chain at least one iminosulfonate group of the formula:

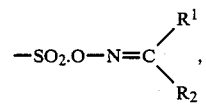

in which $R_1$ and $R_2$ each is selected from hydrogen atom, an alkyl, an acyl, a phenyl, a naphthyl, an anthryl and a benzyl group, or $R_1$ and $R_2$ may, taken together, form an alicyclic ring, the iminosulfonate content being $1.5 \times 10^{-4}$ to $2.5 \times 10^{-3}$ equivalent/g and the resin being free from glycidyl group or the like which may cause polymerization in the presence of sulfonic acid.

1 Claim, No Drawings

POSITIVE TYPE PHOTOSENSITIVE RESINOUS COMPOSITION

FIELD OF INVENTION

The present invention relates to a novel positive type, photosensitive resinous composition and more specifically, to a novel positive type, photosensitive resinous composition comprising a resin having at least one iminosulfonate group, which is specifically useful for the photoresist to be finely processed as, for example, printed circuit board, integrated circuit or the like, and for the lithographic plate.

BACKGROUND OF THE INVENTION

The so-called positive type, photosensitive resin which is insoluble by nature in an aqueous alkali solution, but is liable to be photodecomposed by an actinic radiation as, for example, ultraviolet rays and made to soluble form, is in general far excellent in resolving power than those of negative type photosensitive resinous compositions and hence is widely used as etching resist in the preparation of printed circuit boards, integrated circuit and the like. Among the known positive type photosensitive resinous compositions, the most common member is a resinous composition comprising an alkali soluble novalak resin added with a quinone diazido compound. However, since the base material is a novalak resin prepared by a condensation polymerization technique, there are wide fluctuations of the properties of the resin products and since the softening point is considerably high despite of a comparatively lower molecular weight of the resin, there is a drawback of excessive brittleness of the resist film prepared. Furthermore, it is generally required to add a quantity of quinone diazido compound and therefore, there is a marked decrease in sensitivity of the resulted film to a far lower level as compared with those of chlorinated rubber negative type photoresists.

To cope with the same, attempts have been made to add to an alkali soluble novalak resin with a dihydroxy compound incorporated with a quinone diazido sulfonyl group (see Japanese Patent Application Kokai No. 182632/83) or with a condensation product of bisphenol type compound and quinone diazido sulfonyl chloride (see Japanese Patent Application Kokai No. 203434/83). In these attempts, indeed the sensitivity of the resist film has been somewhat increased, but the inherent drawbacks possessed by novalak resin have not been improved.

There is an another approach wherein a quinone diazido compound is admixed with an acrylic resin which is a copolymer of monoolefinic unsaturated compound and α, β-ethylenically unsaturated carboxylic acid and has a number average molecular weight of 500 to 10,000, in place of novalak resin (see Japanese Patent Application Kokai No. 43451/83). However, such composition has not been practically used because of various problems involved as, for example, difficulties in having good mechanical properties of the resist film and uniform film performance and in having good control of alkali development. This system is characterized in that the used quinone diazido compound is not soluble in an aqueous alkali solution (and soluble in an organic solvent), but when exposed to ultraviolet rays and converted, via ketene, to an indene carboxylic acid, thus formed carboxylic acid is soluble in an aqueous alkali solution. However, the photodecomposition of said quinone diazido compound is carried out effectively only with the help of ultraviolet rays having an absorption maximum at around 400 nm and therefore, it is unable to expect a high resolving power with other rays having an absorption maximum at more shorter range than the same. Various other positive type photosensitive resinous compositions have likewise been known as described, for example, in Japanese Patent Publication No. 2696/81 and Japanese Patent Application Kokai No. 17445/85, in which use is made of polymer having ortho nitrocarbinol ester group; Japanese Patent Application Kokai Nos. 126236/80 and 141422/86, in which the secondary photolysis reaction is generated by utilizing an acid produced by the first photodecomposition reaction, thereby rendering the resin to its soluble form and the like. However, in the former, there is a deficiency in the photosensitivity of the resin film and in the latter, a deficiency in the time stability of the resinous composition. Thus, none of the heretofore proposed compositions have been practically used. It is, therefore, an object of the invention to provide a novel positive type photosensitive resinous composition which is based on a resin having excellent flexibility and adhesion properties and which is excellent in storage stability and capable of being exposed to a variety of light sources, e.g. U.V. light having an absorption maximum at around 200 nm to U.V. light having an absorption maximum at around 400 nm, and hence is excellent in resolving power when exposed to a light with a shorter wave range.

SUMMARY OF THE INVENTION

According to the invention, the aforesaid objects of the invention can be attained with the present positive type photosensitive resinous composition comprising a resin having in its side chains or at the end portions of the main chain, at least one iminosulfonate group of the formula:

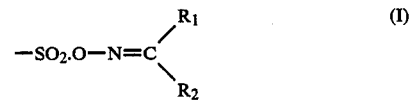

wherein $R_1$ and $R_2$ are the same or different members and each is selected from the group consisting of a hydrogen atom, an alkyl, an acyl, a phenyl, a naphthyl, an anthryl and a benzyl group, or $R_1$ and $R_2$ may combine together to form an alicyclic ring, the iminosulfonate content in the resin molecule being $1.5 \times 10^{-4}$ to $2.5 \times 10^{-3}$ equivalent/g and the resin being free from a functional group which may cause polymerization by the action of sulfonic acid generated by a photolysis.

PREFERRED EMBODIMENTS OF THE INVENTION

More specifically, the present resin is composed of a skeleton resin selected from the group consisting of acryl resin, polyester resin, epoxy resin and epoxidized polybutadiene resin, which has in its side chains or at the end portions of the main chain at least one iminosulfonate group of the abovesaid formula (I), the iminosulfonate content being $1.5 \times 10^{-4}$ to $2.5 \times 10^{-3}$ equivalent/g and more preferably $2.5 \times 10^{-4}$ to $1.5 \times 10^{-3}$ equivalent/g, and which is free from a functional group which may cause polymerization by the action of sulfonic acid, as, for example, a glycidyl group and an epithiopropyl group. The resin, when exposed to an actinic light, must be photodecomposed to liberate a radical of the formula:

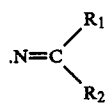 (II)

(wherein $R_1$ and $R_2$ are as defined above) and generate a sulfonic acid group and must be solubilized in an aqueous medium. To attain an optimum solubilization characteristic, said acrylic resin should preferably have a number average molecular weight of about 1,000 to 50,000, and said polyester resin, epoxy resin and epoxidized polybutadiene resin a number average molecular weight of 700 to 5,000. However, solubilization characteristics of a resin are also affected by the amount of photosensitive iminosulfonate groups contained in the resin and the weight ratio of such photosensitive groups to other optional functional groups of the resin. In that sense, the aforesaid molecular weight is not always absolutely necessary to the present resin. What is essential is such that the resin must be an insoluble in an aqueous medium by nature and when photodecomposed to lose the radical of the aforesaid formula (II) and generate sulfonic acid groups, it should be turned to a soluble form in a practical dissolution speed. The resin should also be free from a functional group which may cause polymerization by itself in the presence of a sulfonic acid, as a glycidyl group and epithiopropyl group. Any of the resins fulfilling the aforesaid requirements may satisfactorily be used. The present resin is thus a novel resin having in its side chains or at the end portions of the main chain at least one photolyzable iminosulfonate group of the formula:

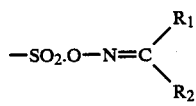 (I)

wherein $R_1$ and $R_2$ are as defined above, which is insoluble in a developer (e.g. an aqueous alkali solution or water) and contains no functional groups which may cause polymerization in the presence of a sulfonic acid. The inventors have previously found that a vinyl resin having an iminosulfonate group of the formula:

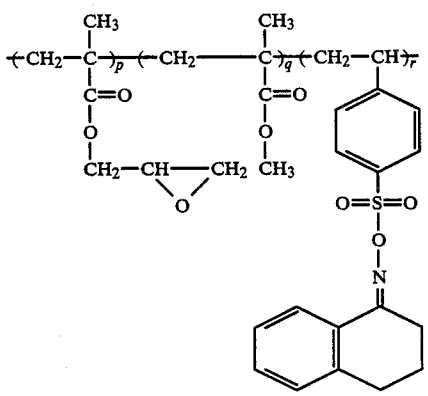

is soluble in an organic solvent as tetrahydrofuran and has a film-forming property and that when the resin is exposed to ultraviolet rays, the radical of the formula:

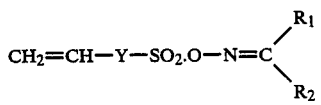

is liberated from the resin, thereby generating sulfonic acid groups. Therefore, when the resin is combined with a crosslinking agent having glycidyl groups, said resin is effectively crosslinked, resulting a highly polymerized, insoluble polymer and hence the resin is quite useful as a negative type photosensitive resin. These facts have been reported in the Journal of Polymer Science Vol. 26, pages 119 to 124 (1986).

The present invention has been made during the course of developmental works of the aforesaid studies. That is, the inventors have surprisingly found that light absorption wave range of the iminosulfonate group of the formula:

$$-SO_2.O-N=C\begin{matrix}R_1\\R_2\end{matrix} \quad (I)$$

wherein $R_1$ and $R_2$ are as defined above may be varied in about 200 to 400 nm with the selection of particular $R_1$ and $R_2$ substituents and that an insoluble polymer having an iminosulfonate group of the formula (I) may be converted, when exposed to ultraviolet rays and decomposed to liberate the radical of the formula:

$$.N=C\begin{matrix}R_1\\R_2\end{matrix} \quad (II)$$

and generate a sulfonic acid group, to a soluble form of polymer, providing having in its molecule no functional group which may cause polymerization in the presence of said sulfonic acid. This type of resin must be useful as a positive type photosensitive resin and the present invention has been made on the basis of the finding of this type of resin.

The present resin is strictly distinguished from the previously mentioned vinyl resin in that no functional groups capable of being crosslinked in the presence of a sulfonic acid are included in the molecule thereof. The present photosensitive resin may be easily and advantageously prepared by using a monomer having an iminosulfonate group of the formula:

$$CH_2=CH-Y-SO_2.O-N=C\begin{matrix}R_1\\R_2\end{matrix} \quad (VI)$$

wherein Y represents an organic group; $R_1$ and $R_2$ are the same or different members and each is selected from the group consisting of hydrogen atom, an alkyl, an acyl, a phenyl, a naphthyl, an anthryl and a benzyl group, or $R_1$ and $R_2$ may, taken together, form an alicyclic ring. The abovesaid monomer (VI) may be obtained by reacting an oxime compound (IV) of the formula:

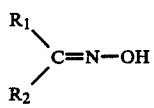 (IV)

in which $R_1$ and $R_2$ are as defined above, derived from the reaction of a ketone of the formula:

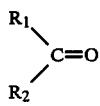 (III)

in which $R_1$ and $R_2$ are as defined above, and a hydroxylamine, with a sulfonic acid halide having $\alpha, \beta$-ethylenic unsaturation of the formula:

$$CH_2=CH-Y-SO_2-X \qquad (V)$$

in which X is a halogen atom and Y is an organic group, in the presence of a base as pyridine.

That is, the present acrylic resin may be prepared by copolymerizing the aforesaid monomer (VI) with other mono olefinic unsaturated compound having no functional group which may cause polymerization by the action of sulfonic acid.

The polyester resin may be prepared by the addition reaction of an unsaturated polyester resin obtained by using a polybasic acid having an unsaturated group, with the aforesaid monomer having an iminosulfonate group. In the case of epoxy resin and epoxidized polybutadiene resin, they may be advantageously prepared by introducing into a base resin $\alpha, \beta$-ethylenically unsaturated bond (e.g. through the reaction of epoxy group and acrylic acid) and effecting addition reaction of said unsaturated bond and said iminosulfonate bearing monomer (VI). The sulfonic acid halide (V) may be freely available in the market or easily synthesized by those skilled in the art by the method described in the Journal of Polymer Science Vol. 21. page 781 (1985) wherein a salt form of a compound having both $\alpha, \beta$-ethylenically unsaturated bond and sulfonic acid group, as, for example, potassium salt of allyl sulfonic acid, methallyl sulfonic acid, styrene sulfonic acid, vinyl sulfonic acid or 2-acrylamide-2-methylpropane sulfonic acid, is reacted with phosphorus pentachloride.

As the oxime of the formula (IV), various compounds have been known and advantageously used in the present invention. Examples are 2-propanone oxime, acetaldoxime, methylethylketoxime, 3-heptanone oxime, cyclohexanone oxime, 1,2-cyclohexane dione dioxime, biacetylmonooxime, acetophenone oxime, p-chloroacetophenone oxime, p-nitroacetophenone oxime, o-nitroacetophenone oxime, p-methylacetophenone oxime, p-phenylacetophenone oxime, benzophenone oxime, methyl $\alpha$-naphthyl ketoxime, 9-anthryl benzylketoxime, tetralone oxime, fluorenone oxime and the like.

In place of using the aforesaid monomer having an iminosulfonate group, the present resin may also be prepared by an alternative method wherein a resin having in its side chains or at the end portions of its main chain at least one sulfonic acid group is subjected to halogenation and thus formed sulfonic acid halide is then reacted with an oxime compound of the formula (IV).

As already stated, in the present invention, it is essential that an iminosulfonate group of the formula:

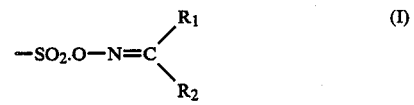 (I)

be included in the resin molecule in an amount of $1.5 \times 10^{-4}$ to $2.5 \times 10^{-3}$ equivalent /g and more preferably $2.5 \times 10^{-4}$ to $1.5 \times 10^{-3}$ equivalent /g. This is because, if the iminosulfonate content is less than the lower limit or higher than the upper limit abovementioned, solubility of the photolyzed resin in an alkali solution is too low or high to give the desired sharp contrast images. In the present invention, it is also essential that the resin be free from any pendant groups which may cause polymerization by themselves (e.g. ring-opening polymerization) in the presence of sulfonic acid, as for example, glycidyl group and epithiopropyl group. This is because, if such groups are present in the resin molecule, they may cause ring-opening polymerization under the influence of sulfonic acid produced by the photolysis, thereby resulting a highly polymerized insoluble resin. Therefore, such resin cannot be used as a positive type photosensitive resin.

It is, however, noted that any of the groups which may not cause polymerization in the presence of sulfonic acid may be present in the resin molecule, if desired. For example, the present resin may have a salt-forming group for electrodeposition purpose.

When the present resin is exposed to a light and the radical of the formula:

 (II)

is liberated by photolysis reaction, sulfonic acid group is always generated and the resin is converted to a soluble form resin. Preferably, such solubilization is controlled mainly by the molecular weight of the skeleton resin used. The inventors have found that in terms of number average molecular weight, the skeleton acrylic resin should preferably have an average molecular weight of about 1,000 to 50,000 and the skeleton polyester resin, epoxy resin or epoxidized polybutadiene resin an average molecular weight of about 700 to 5,000 for the best results in respects of flowability of the resin and solubility of the photodecomposed resin.

As repeatedly stated, the present resin is characterized in that when exposed to an actinic radiation, the characteristic group of the formula:

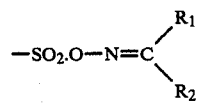

is effectively photodecomposed to give $-SO_3H$ and

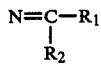

and said actinic radiation may be freely selected from variety of radiations having absorption maximum at different level in 200 to 400 nm range, depending on the type of oxime used. For example, when 2-propanone oxime is used, the most effective radiation should have an absorption maximum at 190 nm; in the case of cyclohexanone oxime, 192 nm; 1,2-cyclohexanedione dioxime, 237 nm; biacetyl monooxime, 228 nm; acetophenone oxime, 242 nm; benzophenone oxime, 252 nm; fluorenone oxime, 254 nm, 360 nm; and tetralone oxime, 254 nm.

Thus, in the present invention, it is possible to design the most suitable resin for a particular exposing unit selected and have a sharp contrast positive image with relatively short wave actinic radiations.

The present photosensitive resinous composition comprises the abovesaid resin dissolved in an organic solvent. As the organic solvent, any of the known members capable of dissolving the present resin may be satisfactorily used. Examples are glycol ethers as ethyleneglycol monoethyl ether, ethyleneglycol monobutyl ether and the like; cellosolve acetates as ethyleneglycol monomethyl ether acetate, ethyleneglycol monoethyl ether acetate and the like; aromatic hydrocarbons as toluene, xylene and the like; ketones as methyl ethyl ketone, cyclohexanone and the like; and esters as ethyl acetate, butyl acetate and the like. The present resinous composition is very useful as a photosensitive material for resist and lithographic use, because the resin is excellent in flexibility and adhesion properties to a base material. Since the photosensitive groups are incorporated in the resin molecule, the resin can exhibit a long-lasting photosensitivity and its time stability is excellent in that sense. As the exposing light, various actinic radiations having absorption maximum at different level in about 200 to 400 nm range may be freely selected and a particularly high contrast image can be obtained with relatively shorter wave length radiations. Thus, the present photosensitive resinous composition is specifically useful in the production of resist material for printed circuit board and integrated circuit and the like. The invention shall be more fully explained in the following examples. Unless otherwise being stated, all parts and % are be weight.

SYNTHETIC EXAMPLE 1

(a) Preparation of tetralone oxime p-styrene sulfonate
Into a 500 ml separable flask, were placed 250 parts of pyridine and 96 parts of tetralone oxime and the mixture was cooled to 10° C. or less. To this, 120 parts of p-styrene sulfonyl chloride were dropwise added and reacted at 20° C. or less for 3 hours. Thereafter, the content was dropwise added to 2500 parts of ice cooled aqueous 5% HCl solution while maintaining stirring and thus obtained solution was extracted with 500 parts of chloroform. The solvent of the chloroform extract was distilled under reduced pressure to obtain the reaction product, which was identified, by IR and NMR analysis means, to be tetralone oxime p-styrene sulfonate.

(b) Preparation of iminosulfonate group bearing polyester resin

Into a 1 liter separable flask, were placed 73.5 parts of maleic anhydride, 110 parts of adipic acid, 295 parts of neopentylglycol, 14 parts of xylene and 0.2 part of dibutyl tin oxide and the mixture was heated to 140° C. and maintained at the same temperature for 1 hour. Then the temperature was gradually raised to 200° C. in 3 hours and the reaction was continued until the acid value based on carboxylic acids reached 20. After cooling to 80° C., the mixture was added with 160 parts of xylene and 80 parts of ethyleneglycol monobutyl ether. To this, a mixture of 20 parts of styrene, 140 parts of the tetralone oxime p-styrene sulfonate obtained in the preceding paragraph (a), 9 parts of t-butyl peroxy 2-ethyl hexanoate and 4.5 parts of di-t-butyl peroxide was dropwise added and the combined mixture was reacted at 140° C. for 3 hours to obtain an iminosulfonate group bearing polyester resin varnish having a solid content of 70.4%. The molecular weight of the resin was about 3,200.

SYNTHETIC EXAMPLE 2

(a) Preparation of acetophenone oxime 2-acrylamide-2-methylpropane sulfonate
The similar procedures as stated in Synthetic Example 1 were repeated excepting substituting 81 parts of acetophenone oxime for 96 parts of tetralone oxime and 140 parts of 2-acrylamide-2-methylpropanesulfonyl chloride for 120 parts of p-styrenesulfonyl chloride to obtain acetophenone oxime 2-acrylamide-2-methylpropane sulfonate.

(b) Preparation of iminosulfonate group bearing polyester resin

Into a 2 liters separable flask, were placed 73.5 parts of maleic anhydride, 141 parts of azelaic acid, 240 parts of hydrogenated bisphenol A, 118 parts of 1,6-hexanediol, 20 parts of oxylene and 0.2 parts of dibutyl tin oxide and the mixture was heated to 140° C. and maintained at the same temperature for 1 hour. The inner temperature was then gradually raised to 200° C. in 3 hours and the reaction was continued until the acid value based on carboxylic acid reached 30. After cooling to 80° C., the mixture was added with 200 parts of xylene and 90 parts of ethyleneglycol monobutyl ether and then dropwise added with a mixture of 20 parts of styrene, 162 parts of acetophenone oxime -2-acrylamide-2-methylpropane sulfonate obtained in the preceding paragraph (a), 9 parts of t-butylperoxy-2-ethyl hexanoate and 4.5 parts of di-t-butylperoxide and the combined mixture was reacted at 140° C. for 3 hours to obtain an iminosulfonate group bearing polyester resin varnish having a solid content of 70.0%. The molecular weight of the resin was about 3,000.

SYNTHETIC EXAMPLE 3

(b) Preparation of iminosulfonate group bearing acrylic resin

Into a 1 liter separable flask, were placed 250 parts of ethyleneglycol monobutyl ether and it was heated to 120° C. A mixture of 150 parts of methyl methacrylate, 200 parts of n-butyl acrylate, 50 parts of acetophenone oxime 2-acrylamide-2-methylpropane sulfonate obtained in the Synthetic Example 2 (a) and 8 parts of azobisisobutyronitrile was dropwise added to said flask in 3 hours and the combined mixture was, after elapsing 30 minutes, added dropwise with a mixture of 30 parts of ethyleneglycol monobutyl ether and 1 part of azobisisobutyronitrile in 30 minutes. Then, the combined mixture was reacted at the same temperature for 1 hour to obtain an iminosulfonate group bearing acrylic resin varnish having a solid content of 58.0%. The molecular weight of the resin was about 20,000.

SYNTHETIC EXAMPLE 4

(a) Preparation of fluorenone oxime p-styrenesulfonate The similar procedures as stated in Synthetic Example 1(a) were repeated excepting sbustituting 117 parts of fluorenone oxime for 96 parts of tetralone oxime to obtain fluorenone oxime p-styrene sulfonate.

(b) Preparation of iminosulfonate group bearing acrylic resin

Into a 1 liter separable flask, were placed 200 parts of ethyleneglycol monobutyle ether and the content was heated to 120° C.To this, was dropwise added a mixture of 140 parts of ethyl methacrylate, 60 parts of n-butyl methacrylate, 50 parts of the fluorenone oxime p-styrene sulfonate obtained in the preceding paragraph (a) and 8 parts of azobisisobutyronitrile in 3 hours and after elapsing 30 minutes, a mixture of 30 parts of ethyleneglycol monobutyl ether and 1 part of azobisisobutyronitrile in 30 minutes. The combined mixture was reacted at the same temperature for 1 hour to obtain an iminosulfonate group bearing acrylic resin varnish having a solid content of 51.1%. The molecular weight of the resin was about 30,000.

SYNTHETIC EXAMPLE 5

(a) Preparation of methylethylketoxime methallylsulfonate The similar procedures as stated in Synthetic Example 1(a) were repeated excepting substituting 50 parts of methylethyl ketoxime for 96 parts of tetralone oxime and 95 parts of methallylsulfonyl chloride for 120 parts of p-styrene sulfonyl chloride to obtain methylethyl ketoxime methallylsulfonate.

(b) Preparation of iminosulfonate group bearing acrylic resin

Into a 1 liter separable flask, were placed 200 parts of ethyleneglycolmonobutyl ether and the content was heated to 120° C. To this, was dropwise added a mixture of 118 parts of methyl methacrylate, 38 parts of n-butyl methacrylate, 44 parts of ethyl acrylate, 30 parts of the methylethyl ketoxime methallylsulfonate obtained in the preceding paragraph (a) and 12 parts of azobisisobutyronitrile in 3 hours and after elapsing 30 minutes, a mixture of 30 parts of ethyleneglycol monobutylether and 1 part of azobisisobutyronitrile in 30 minutes. Thereafter, the combined mixture was reacted at the same temperature for 1 hour to obtain an iminosulfonate group bearing acrylic resin varnish having a solid content of 48.6%. The molecular weight of the resin was about 5,000.

SYNTHETIC EXAMPLE 6

(b) Preparation of iminosulfonate group bearing acrylic reisn

Into a 1 liter separable flask, were placed 250 parts of ethyleneglycol monobutyl ether and the content was heated to 100° C. To this, was dropwise added a mixture of 100 parts of methyl methacrylate, 160 parts of dimethylaminoethyl methacrylate, 25 parts of ethyl acrylate, 50 parts of the fluorenone oxime p-styrene sulfonate obtained in Synthetic Example 4(a) and 8 parts of axobisisobutyronitrile in 4 hours and after elapsing 30 minutes, a mixture of 50 parts of ethyleneglycol monobutyl ether and 1 part of azobisisobutyronitrile in 30 minutes to obtain an iminosulfonate group bearing acrylic resin varnish having a solid content of 52.0%. The molecular weight of the resin was about 50,000.

SYNTHETIC EXAMPLE 7

(a) Preparation of benzophenone oxime p-styrene sulfonate The similar procedures as stated in Synthetic Example 1 (a) were repeated excepting substituting 116 parts of benzophenone oxime for 96 parts of tetralone oxime to obtain benzophenone oxime p-styrene sulfonate.

(b) Preparation of iminosulfonate group bearing acrylic resin

Into a 1 liter separable flask, were placed 25 parts of ethyleneglycol monobutyl ether and the content was heated to 100° C. To this, was dropwise added a mixture of 100 parts of methyl methacrylate, 250 parts of diethylaminoethyl methacrylate, 50 parts of n-butyl acrylate, 70 parts of the benzophenone oxime p-styrene sulfonate obtained in the preceding paragraph (a),and 12 parts of azobisisobutyronitrile in 4 hours and after elapsing 30 minutes, a mixture of 100 parts of ethyleneglycol monobutyl ether and 2 parts of azobisisobutyronitrile in 30 minutes. Then the combined mixture was reacted at the same temperature for 1 hour to obtain an iminosulfonate group bearing acrylic resin varnish having a solid content of 56.4%. The molecular weight of the resin was about 20,000.

SYNTHETIC EXAMPLE 8

(b) Preparation of iminosulfonate group bearing acrylic resin

Into a 1 liter separable flask, were placed 250 parts of ethyleneglycol monobutyl ether and the content was heated to 120° C. To this, were dropwise added a mixture of 180 parts of methyl methacrylate, 26 parts of methacrylic acid, 130 parts of n-butyl acrylate, 70 parts of the tetralone oxime p-styrene sulfonate obtained in Synthetic Example 1(a), and 8 parts of azobisisobutyronitrile in 4 hours, and after elapsing 30 minutes a mixture of 50 parts of ethyleneglycol monobutyl ether and 1 part of azobisisobutyronitrile in 30 minutes. Thereafter, the combined mixture was reacted at the same temperature for 1 hour to obtain an iminosulfonate group bearing acrylic resin varnish having a solid content of 56.8% and a resinous acid value of 23.5. The molecular weight of the resin was about 40,000.

SYNTHETIC EXAMPLE 9

(b) Preparation of iminosulfonate group bearing epoxy resin Into a 1 liter separable flask, were placed 150 parts of ethyleneglycol monoethyl ether acetate and 285 parts of bisphenol A type epoxy resin (epoxy equivalent 950) and the epoxy resin was dissolved by heating the mixture to 150° C. After cooling the mixture to 100° C., a mixture of 26 parts of methacrylic acid, 3 parts of chlorinated tetramethyl ammonium and 0.02 part of hydroquinone was added and reacted for 2 hours. Then the content was cooled to 80° C. and dropwise added with a mixture of 67 parts of methylethyl ketoxime methalkyl sulfonate obtained in Synthetic Example 5(a), 150 parts of dioxane and 5 parts of azobisisobutyronitrile in 2 hours to obtain an iminosulfonate group bearing epoxy resin varnish having a solid content of 55.1%. The molecular weight of the resin was about 2,200.

SYNTHETIC EXAMPLE 10

(b) Preparation of iminosulfonate group bearing epoxy resin Into a 1 liter separable flask, were placed 200 parts of ethyleneglycol monoethyl ether acetate and 380 parts of bisphenol A type epoxy resin (epoxy equivalent 1900) and the resin was dissolved by heating the mixture at 150° C. After cooling to 100° C., a mixture of 18 parts of methacrylic acid, 3 parts of chlorinated tetramethylammonium and 0.02 part of hydroquinone was added and the combined mixture was reacted for 2 hours. Then the mixture was cooled to 80° C. and added dropwise with a mixture of 66 parts of tetralone oxime p-styrene sulfonate obtained in Synthetic Example 1(a), 150 parts of dioxane and 5 parts of azobisisobutyronitrile in 2 hours to obtain an iminosulfonate group bearing epoxy resin varnish having a solid content of 56.4%. The molecular weight of the resin was about 3,700.

SYNTHETIC EXAMPLE 11

(b) Preparation of iminosulfonate group bearing epoxy resin Into a 1 liter separable flask, were placed 180 parts of ethyleneglycol monoethyl ether acetate and 285 parts of bisphenol A type epoxy resin (epoxy equivalent 950) and the resin was dissolved by heating the mixture at 150° C. After cooling to 100° C., a mixture of 22 parts of acrylic acid, 3 parts of chlorinated tetramethyl ammonium and 0.02 part of methoquinone was added and the combined mixture was reacted for 2 hours. Then the mixture was cooled to 80° C. and added dropwise a mixture of 97 parts of acetophenone oxime 2-acrylamide-2-methylpropane sulfonate obtained in Synthetic Example 2(a), 140 parts of dioxane and 5 parts of azobisisobutyronitrile in 2 hours to obtain an iminosulfonate group bearing epoxy resin varnish having a solid content of 55.2 %. The molecular weight of the resin was about 2,000.

SYNTHETIC EXAMPLE 12

(b) Preparation of iminosulfonate group bearing polybutadiene resin
Into a 1 liter separable flask, were placed 435 parts of Idemitsu polybutadiene R-45EPT ( trademark of Idemitsu Sekiyu, epoxidized polybutadiene) and 150 parts of ethyleneglycol monomethyl ether acetate and the resin was dissolved by heating the mixture at 100° C. To this, was added a mixture of 22 parts of acrylic acid, 3 parts of chlorinated tetramethyl ammonium and 0.02 part of hydroquinone and reaced for 2 hours. After cooling to 80° C., a mixture of 120 parts of fluorenone oxime p-styrene sulfonate obtained in synthetic Example 4(a), 150 parts of dioxane and 5 parts of azobisisobutyronitrile was dropwise added in 2 hours to obtain an iminosulfonate group bearing polybutadiene resin varnish having a solid content of 65.2 %. The molecular weight of the resin was about 4,000.

SYNTHETIC EXAMPLE 13

(b) Preparation of iminosulfonate group bearing polybutadiene resin
Into a 1 liter separable flask, were placed 290 parts of Idemitsu Polybutadiene R-45EPT (trademark of Idemitsu Sekiyu, epoxidized polybutadiene) and 150 parts of ethyleneglycol monomethyl ether acetate and the resin was dissolved by heating the mixture at 100° C. To this, a mixture of 17 parts of methacrylic acid, 2 parts of chlorinated tetramethylammonium and 0.02 part of hydroquinone was added and the combined mixture was reacted for 2 hours. After cooling to 80° C., a mixture of 73 parts of benzophenone oxime p-styrene sulfonate obtained in Synthetic Example 7(a), 150 parts of dioxane and 4 parts of azobisisobutyronitrile was dropwise added in 2 hours to obtain an iminosulfonate group bearing polybutadiene resin varnish having a solid content of 55.4%. The molecular weight of the resin was about 3,600.

EXAMPLE 1

40 parts of the iminosulfonate group bearing modified polyester resin obtained in Synthetic Example 1(b) were dissolved in a mixture of 40 parts of ethyleneglycol monoethyl ether and 40 parts of methyl ethyl ketone and thus obtained solution was filtered through 0.2 $\mu$m Millipore filter to get a photosensitive solution. Thus prepared solution was applied on a silicone oxide film wafer by using a spinner and the wafer was dried in an oven at 80° C. for 10 minutes to obtain a photosensitive coating of 1.3 $\mu$m dry thickness.

Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in an aqueous 2 % tetramethyl ammonium hydroxide solution at 25° C. for 60 seconds. When examined thus obtained resist by an electron microscope, it was found that clear image was detected as fine as 0.8 $\mu$m level and no peeling and cracks of the resist were observed. The similar good results were obtained with the photosensitive solution having stored for 3 months.

EXAMPLE 2

40 parts of the iminosulfonate group bearing modified polyester resin obtained in Synthetic Example 2(b) were dissolved in a mixture of 40 parts of ethyleneglycol monoethyl ether and 40 parts of methyl ethyl ketone and thus obtained solution was filtered through 0.2 $\mu$m Millipore filter to get a photosensitive solution. Thus prepared solution was applied on a silicone oxide film wafer by using a spinner and the wafer was dried in an oven at 80° C. for 10 minutes to obtain a photosensitive coating of 1.3 $\mu$m dry thickness.

Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in an aqueous 2 % tetramethyl ammonium hydroxide solution at 25° C. for 60 seconds. When examined thus obtained resist by an electron microscope, it was found that clear image was detected as fine as 0.9 $\mu$m level and no peeling and cracks of the resist were observed. The similar good results were obtained with the photosensitive solution having stored for 3 months.

EXAMPLE 3

40 parts of the iminosulfonate group bearing acrylic resin obtained in Synthetic Example 3(b) were dissolved in a mixture of 26 parts of ethyleneglycol monoethyl ether and 26 parts of methyl ethyl ketone and thus obtained solution was filtered through 0.2 $\mu$m Millipore filter to get a photosensitive solution. Thus prepared solution was applied on a silicone oxide film wafer by using a spinner and the wafer was dried in an oven at 80° C. for 10 minutes to obtain a photosensitive coating of 1.3 $\mu$m dry thickness.

Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in an aqueous 2% tetramethyl ammonium hydroxide solution at 25° C. for 60 seconds, When examined thus obtained resist by an electron microscope, it was found that clear image was detected as fine a 0.7 μm level and no peeling and cracks of the resist were observed. The similar good results were obtained with the photosensitive solution having stored for 3 months.

EXAMPLE 4

40 parts of the iminosulfonate group bearing acrylic resin obtained in Synthetic Example 4(b) were dissolved in a mixture of 25 parts of ethyleneglycol monoethyl ether and 25 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.2 μm dry thickness. Onto thus prepared photosensitive coating, a line and space pattern was closely placed and the sandwich was exposed to a low pressure mercury lamp (light intensity at 365 nm, about 5 mW/cm$^2$) for 60 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.6 μm level and no peeling and cracks of the resist were observed. The similar good results were obtained with the photosensitive solution having stored for 3 months.

EXAMPLE 5

50 parts of the iminosulfonate group bearing acrylic resin obtained in Synthetic Example 5(b) were dissolved in a mixture of 30 parts of ethyleneglycol monoethyl ether and 30 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 mintues to obtain a photosensitive coating of 1.3 μm dry thickness.

Onto thus prepared photosensitive coating, a line and space pattern was closely placed and the sandwich was exposed to a low pressure mercury lamp (light intensity at 254 nm, about 10 mW/cm$^2$) for 100 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.7 μm level and no peeling and cracks of the resist were observed. The similar good results were obtained with the photosensitive solution having stored for 3 months.

EXAMPLE 6

40 parts of the iminosulfonate group bearing acrylic resin obtained in Synthetic Example 6(b) were dissolved in a mixture of 20 parts of ethyleneglycol monoethyl ether and 24 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.2 μm dry thickness. Onto thus prepared photosensitive coating, a line and space pattern was closely placed and the sandwich was exposed to a low pressure mercury lamp (light intensity at 365 nm, about 5 mW/cm$^2$) for 40 seconds and then the photosensitive coating was developed in a mixture (weight ratio 1:2) of aqueous 0.6% acetic acid solution and aqueous 0.8% sodium acetate solution at 25° C. for 60 seconds. When examined thus obtained resist by an electron microscope, it was found that clear image was detected as fine as 0.7 μm level and no peeling and cracks of the resist were observed. The similar good results were obtained with the photosensitive solution having stored for 3 months.

EXAMPLE 7

40 parts of the iminosulfonate group bearing modified polyester resin obtained in Synthetic Example 7(b) were dissolved in a mixture of 26 parts of ethyleneglycol monoethyl ether and 26 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.3 μm dry thickness. Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in a mixture (weight ratio 1:2) of aqueous 0.6% acetic acid solution and aqueous 0.8% sodium acetate solution at 25° C. for 60 seconds. When examined thus obtained resist by an electron microscope, it was found that clear image was detected as fine as 0.6 μm level and no peeling and cracks of the resist were observed. The similar good results were obtained with the photosensitive solution having stored for 3 months.

EXAMPLE 8

To 100 parts of the iminosulfonate group bearing acrylic resin varnish obtained in Synthetic Example 8(b), were gradually added 4 parts of triethylamine and 280 parts of deionized water under stirring to obtain an electro deposition bath liquid.

Copper plated, circuit board base plate having through-holes was then dipped into said bath and said base plate was connected to a positive electrode and the facing electrode to a negative electrode. 50 V direct current was then passed through the bath for 2 minutes to cause deposition of about 7 μm thickness of anionic, positive type photosensitive resin film on the base plate and thus treated plate was then washed with water and dried at 100° C. for 5 minutes.

Onto thus prepared plate, a positive type photo-tool having circuit pattern was closely connected and the sandwich was exposed, from its both sides, to a low-pressure mercury lamp (light intensity at 254 nm, about 10 mW/cm$^2$) for 60 seconds. Then, the exposed plate was developed in aqueous 1% sodium carbonate solution at 30° C. for 90 seconds to form the desired resist pattern.

Still remained and undesired copper was then removed by subjecting the plate to an etching operation in an aqueous ferric chloride solution at 40° C. for 120 seconds and finally, the resist film was removed in an aqueous 5% sodium hydroxide solution at 50° C. for 90 seconds, to obtain a circuit board having 50 μm line width pattern and through-holes.

EXAMPLE 9

40 parts of the iminosulfonate group bearing epoxy resin obtained in Synthetic Example 9(b) were dissolved in a mixture of 24 parts of ethyleneglycol monoethyl ether and 24 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.2 μm dry thickness.

Onto thus prepared photosensitive coating, a line and space pattern was closely placed and the sandwich was exposed to a low pressure mercury lamp (light intensity at 254 nm, about 10 mW/cm$^2$) for 100 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.6 μm level and no peeling and cracks of the resist were observed. The similar good results were obtained with the photosensitive solution having stored in 3 months.

EXAMPLE 10

40 parts of the iminosulfonate group bearing epoxy resin obtained in Synthetic Example 10(b) were dissolved in a mixture of 24 parts of ethyleneglycol monoethyl ether and 24 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.2 μm dry thickness.

Onto thus prepared photosensitive coating, a line and space pattern was closely placed and the sandwich was exposed to a low pressure mercury lamp (ligh intensity at 254 nm, about 10 mW/cm$^2$) for 60 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.8 μm level and no peeling and cracks of the resist were observed. The similar good results were obtained with the photosensitive solution having stored for 3 months.

EXAMPLE 11

40 parts of the iminosulfonate group bearing epoxy resin obtained in Synthetic Example 11(b) were dissolved in a mixture of 24 parts of ethyleneglycol monoethyl ether and 24 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.3 μm dry thickness.

Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.8 μm level and no peeling and cracks of the resist were observed. The similar good results were obtained with the photosensitive solution having stored for 3 months.

EXAMPLE 12

40 parts of the iminosulfonate group bearing polybutadiene resin obtained in Synthetic Example 12(b) were dissolved in a mixture of 32 parts of ethyleneglycol monoethyl ether and 32 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.3 μm dry thickness.

Onto thus prepared photosensitive coating, a line and space pattern was closely placed and the sandwich was exposed to a low pressure mercury lamp (light intensity at 365 nm, about 5 mW/cm$^2$) for 40 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.8 μm level and no peeling and cracks of the resist were observed. The similar good results were obtained with the photosensitive solution having stored for 3 months.

EXAMPLE 13

40 parts of the iminosulfonate group bearing polybutadiene resin obtained in Synthetic Example 13(b) were dissovled in a mixture of 24 parts of ethyleneglycol monoethyl ether and 24 parts of methyl ethyl ketone and thus obtained solution was filtered through 0.2 μm Millipore filter to get a photosensitive solution. Thus prepared solution was applied on a silicone oxide film wafer by using a spinner and the wafer was dried in an oven at 80° C. for 10 minutes to obtain a photosensitive coating of 1.3 μm dry thickness.

Onto thus prepared photosensitive coating, a line and space pattern was closely placed and the sandwich was exposed to a low pressure mercury lamp (light intensity at 254 nm, about 10 mW/cm$^2$) for 60 seconds and then the photosensitive coating was developed in an aqueous 2% tetramethyl ammonium hydroxide solution at 25° C. for 60 seconds. When examined thus obtained resist by an electron microscope, it was found that clear image was detected as fine as 0.9 μm level and no peeling and cracks of the resist were observed. The similar good results were obtained with the photosensitive solution having stored for 3 months.

What is claimed is:

1. A positive type photosensitive resinous composition comprising a resin having in its side chains or at the end portions of main chain at least one iminosulfonate group of the formula:

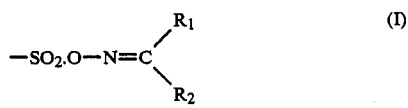

in which $R_1$ and $R_2$ are the same or different members and each is selected from the group consisting of a hydrogen atom, an alkyl, an acyl, a phenyl, a naphthyl an anthryl and a benzyl group, or $R_1$ and $R_2$ may, taken together, form an alicylic ring, the resin being selected from the group consisting of acrylic resin, polyester resin, epoxy resin and epoxidized polybutadiene resin, the iminosulfonate content in the resin molecule being $1.5 \times 10^{-4}$ to $2.5 \times 10^{-3}$ equivalent / g and the resin being free from a functional group which may cause polymerization by the action of sulfonic acid generated by a photolysis of said iminosulfonate group.

* * * * *